(12) United States Patent
Iijima (10) Patent No.: US 7,220,315 B2
(45) Date of Patent: May 22, 2007

(54) METHOD OF PRODUCING POLYCRYSTALLINE THIN FILM AND METHOD OF PRODUCING AN OXIDE SUPERCONDUCTING ELEMENT

(75) Inventor: Yasuhiro Iijima, Tokyo (JP)

(73) Assignee: Fujikura Ltd., Tokyo (JP)

( * ) Notice: Subject to any disclaimer, the term of this patent is extended or adjusted under 35 U.S.C. 154(b) by 649 days.

(21) Appl. No.: 10/628,459

(22) Filed: Jul. 29, 2003

(65) Prior Publication Data

US 2004/0023811 A1 Feb. 5, 2004

(30) Foreign Application Priority Data

Aug. 2, 2002 (JP) ............ P2002-226625

(51) Int. Cl.
*C30B 25/12* (2006.01)
*C30B 25/24* (2006.01)

(52) U.S. Cl. .................. 117/95; 117/103; 427/423; 505/237

(58) Field of Classification Search ............ 505/238, 505/237; 427/423; 117/92, 95, 103
See application file for complete search history.

(56) References Cited

U.S. PATENT DOCUMENTS 6,150,034 A 11/2000 Paranthaman et al.
6,716,796 B1 * 4/2004 Iijima et al. ............ 505/238

FOREIGN PATENT DOCUMENTS

| JP | 6-145977 | 5/1994 |
|---|---|---|
| JP | 9-120719 | 5/1997 |
| JP | 10-121239 | 5/1998 |
| JP | 2001-114594 | 4/2001 |
| WO | WO 01/29293 A1 | 4/2001 |
| WO | WO 02/47119 A2 | 6/2002 |

OTHER PUBLICATIONS

D F Lee et al. "Alternative Buffer Architectures for High Critical Current Density YBCO Superconducting Deposits on Rolling Assisted Biaxially-Textured Substrates", Japanese Journal of Applied Physics, Japan Society of Application Physics, Tokyo, JP, vol. 38, No. 2B, 1999, pp. L178-L180, XP000910949.
Iijima et al., "Ion Beam Induced Growth Structure of Fluorite Type Oxide Films for Biaxally Textured HTSC Coated Conductors", Materials Research Society Symposium Proceedings, Materials Research Society, Pittsburg, PA, co. 585, 2000, pp. 45-54, XP001119125.

* cited by examiner

*Primary Examiner*—Felisa Hiteshew
(74) *Attorney, Agent, or Firm*—Sughrue Mion, PLLC

(57) ABSTRACT

A production method for a polycrystalline thin film, depositing polycrystalline thin film on a polycrystalline substrate. The temperature of the polycrystalline substrate is set within a range from 150° C. to 250° C., the ion beam energy of the ion beam is adjusted within a range from 175 eV to 225 eV, and the ion beam is irradiated at an angle of incidence from 50° to 60° with respect to the normal for the film forming surface of the polycrystalline substrate. By this production method, the grain boundary inclination angle, formed by identical crystal axes of the crystal grains along a plane parallel to the film forming surface of the polycrystalline substrate, is limited to 20° or less, and a polycrystalline thin film having a strong crystal orientation can be stably produced.

9 Claims, 8 Drawing Sheets

METHOD OF PRODUCING
POLYCRYSTALLINE THIN FILM AND
METHOD OF PRODUCING AN OXIDE
SUPERCONDUCTING ELEMENT

BACKGROUND OF THE INVENTION

1. Field of the Invention

The present invention relates to a production method for a polycrystalline thin film having the crystal structure of a C-type rare earth oxide with a well-ordered crystal alignment and a production method for an oxide superconducting element with superior superconductive properties that comprises the polycrystalline thin film and an oxide superconductive layer provided thereon.

Priority is claimed under 35 U.S.C. 119 to Japanese patent application No. 2002-226625, filed on Aug. 2, 2002, which is incorporated herein by reference.

2. Description of the Related Art

Oxide superconducting elements discovered in recent years are superior superconductors that exhibit a critical temperature that exceeds the temperature of liquid nitrogen, but presently the various problems described below must be solved in order to use this type of oxide superconducting element as a practical superconductor. One of the problems is that the critical current density of the oxide superconducting element is low. The problem of the low critical current density of the oxide superconducting element is largely caused by the anisotropic electrical properties intrinsic to the crystal of the oxide superconducting element. In particular, it is known that although electricity flows readily along the a-axis direction and the b-axis direction of the oxide superconducting element, it does not flow readily along the c-axis direction. Thus, in order to form an oxide superconducting element on a substrate and use it as a superconductor, it is necessary to form an oxide superconducting element that has a good crystal orientation on the substrate. Furthermore, it is necessary to align the a-axis and the b-axis of the crystal of the oxide superconducting element in the direction in which the electricity has to flow and to align the c-axis of the oxide superconducting element in another direction.

Thus, conventionally, a sputtering apparatus is used when forming the oxide superconducting element on a substrate such as a metal tape, and an intermediate layer that has a good crystal orientation consisting of MgO, SrTiO$_3$, or the like, is formed on the substrate beforehand. However, when the oxide superconducting layer is formed on a monocrystal substrate comprising these materials, the critical current density is several ten-thousands of A/cm$^2$, while in contrast, the oxide superconducting layer formed on the intermediate layer described here only attains a critical current density having the extremely low value of about 1,000 to 10,000 A/cm$^2$. This is thought to occur for the following reasons.

Figure 11:
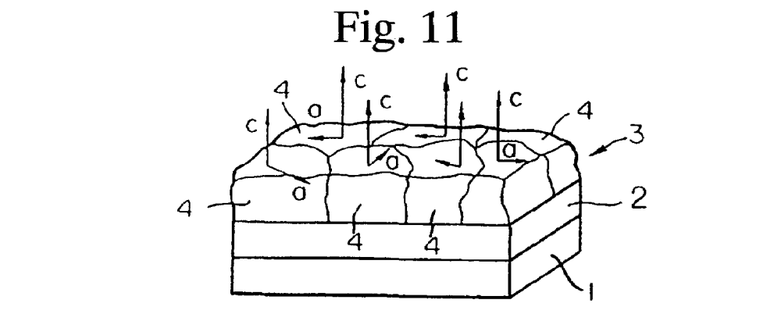
FIG. 11 is a schematic structural drawing showing a polycrystalline thin film produced by a conventional production method.

FIG. 11 shows the cross-sectional structure of an oxide superconducting element wherein an intermediate layer 2 is formed on a substrate 1 of a polycrystalline material such as a metal tape, and an oxide superconducting layer 3 is formed as a layer by a sputtering method on this intermediate layer 2. In the structure shown in FIG. 11, the oxide superconducting layer 3 is in a polycrystalline state, where numerous crystal grains 4 are randomly bonded. Individually, the c-axis of each of the crystal grains 4 exhibits a perpendicular orientation with respect to the surface of the substrate 1, while the a-axis and the b-axis are oriented in random directions.

It is thought that when the a-axis and the b-axis of each of the crystal grains that form the oxide superconducting layer are randomly oriented, the quantum coupling in the superconducting state is lost at the crystal grain boundaries where the crystal orientations have become disrupted, and as a result, this causes a deterioration in the superconductive properties, in particular, the critical current density. In addition, it appears the cause of the oxide superconducting element developing into a polycrystalline state in which the a-axis and the b-axis are not aligned is that the intermediate layer 2 formed therebelow is in a polycrystalline state randomly oriented along the a-axis and the b-axis. In other words, it appears that the oxide superconducting layer 3 grows in conformity to the crystals of the intermediate layer 2 as a result of the oxide superconducting layer being formed on an intermediate layer 2 that has such a state.

Thus, the inventor discovered that if first an intermediate layer of yttria-stabilized zirconia (ZrO$_2$—Y$_2$O$_3$; abbreviated YSZ), which has a good orientation along the a-axis and the b-axis, is formed in advance on a polycrystalline substrate using a special technique, and an oxide superconducting layer is then formed on this intermediate layer, it becomes possible to produce an oxide superconducting element that exhibits a good critical current density. The inventor has filed patent applications in connection with this technology, such as Japanese Patent Application, First Publication No. Hei 06-145977, Japanese Patent Application, First Publication No. Hei 09-120719, and Japanese Patent Application, First Publication No. Hei 10-121239.

In the technology disclosed in these patent applications, when the YSZ film consisting of the desired constituents is formed on a polycrystalline substrate by sputtering a base material (referred to as the target) consisting of YSZ, crystals of YSZ having an unfavorable crystal orientation can be selectively eliminated by concurrently carrying out an ion beam assist, in which an ion beam such as Ar$^+$ is irradiated from an oblique direction with respect to the film forming surface of this polycrystalline substrate. The crystals of YSZ having a good crystal orientation can be thereby selectively deposited. Thus, it is possible to form an intermediate layer of YSZ having a superior orientation.

As described above, according to the technology disclosed in applications previously filed by the inventor, it is possible to obtain a polycrystalline thin film of YSZ having favorably oriented a-axes and the b-axes, and it is possible to verify that the oxide superconducting element formed on this polycrystalline thin film exhibits a strong critical current density. Thus, the present inventor initiated investigations of technology for producing an intermediate layer comprising a more preferable polycrystalline thin film from different materials.

Figure 12:
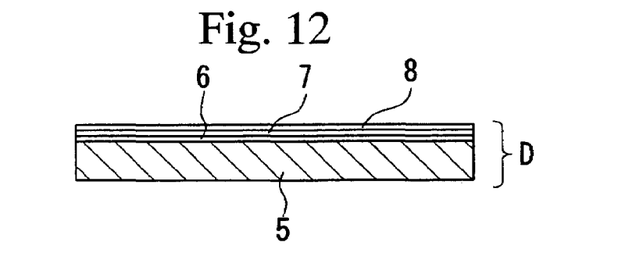
FIG. 12 is a schematic cross-sectional drawing showing an example of a conventional oxide superconducting element.

FIG. 12 shows the cross-sectional structure of an example of an oxide superconducting element that the inventor has recently used. The oxide superconducting element D has a four-layer structure made by forming an intermediate layer 6 for orientation control comprising YSZ or MgO on a metal tape base 5 using the technology explained above; next a reaction inhibiting intermediate layer 7 comprising Y$_2$O$_3$ is formed; and then the oxide superconducting layer 8 is formed thereon.

The reason for using this type of four-layer structure is to prevent diffusion reactions that occur between the intermediate layer consisting of YSZ and the oxide superconducting layer having a YBa$_2$Cu$_3$O$_{7-x}$ (0<X<0.5) composition. Specifically, in order to obtain the oxide superconducting layer having a YBa$_2$Cu$_3$O$_{7-x}$ (0<X<0.5) composition, after forming the oxide superconducting layer having the objective composition by using a film forming technique such as sputtering, temperature treatment must be carried out by heating the oxide superconducting layer to several 100 degrees. Due to the heat supplied during this heat treatment, a diffusion reaction of elements is promoted between the intermediate layer consisting of YSZ and the oxide superconducting layer having a $YBa_2Cu_3O_{7-x}$ (0<X<0.5) composition. Thus there is a concern that the superconducting properties will deteriorate. However, this four-layer structure effectively contributes to preventing this.

The YSZ crystal that forms the intermediate layer 6 for orientation control has a cubic system crystal structure, while the oxide superconducting layer having a $YBa_2Cu_3O_{7-x}$ (0<X<0.5) composition has what is termed a perovskite structure. While both are a type of face-centered cubic structure and have similar crystal lattices, there is a difference of about 5° in the grid interval of their crystal lattices. For example, in the case of YSZ, the distance between the nearest atoms, specifically, the atom positioned at a corner of the cubic lattice and the atom positioned at the center of a face of the cubic lattice, is 3.65 Å (where 10 Å=1 nm). This same distance between nearest atoms for $Yb_2O_3$ is 3.69 Å, and this same distance between nearest atoms for the oxide superconducting layer having a $YBa_2Cu_3O_{7-x}$ (0<X<0.5) composition is 3.81 Å. The distance between nearest atoms for $Yb_2O_3$ shows an intermediate value between those of the YSZ and $YBa_2Cu_3O_{7-x}$ (0<X<0.5). Thus $Yb_2O_3$ is thought to be effective for bridging the difference in the sizes of the lattices and to be effective as an intermediate layer for preventing reactions due to their compositions being similar.

However, as shown in FIG. 12, in the four-layer structure, the number of necessary layers becomes large, and thus there the problem that the number production steps increases.

Thus, with the object of forming a reaction-preventing intermediate layer 7 having a good orientation directly on a polycrystalline base 5, the inventor attempted to form a polycrystalline thin film to serve as the reaction preventing intermediate layer 7 on the polycrystalline base 5 using ion beam assist technology disclosed in patent applications previously filed by the inventor. This polycrystalline thin film comprises crystal grains of an oxide having the crystal structure of a C-type rare earth oxide represented by any of the formulas: $Y_2O_3$, $Sc_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Yb_2O_3$, $Lu_2O_3$, and $Pm_2O_3$, and has grain boundary inclination angles, formed between the same crystal axes of the crystal grains along the plane parallel to the film forming surface of the polycrystalline base 5, that are controlled to within 30°.

As a result, the inventor discovered that by first using the ion beam assist technology disclosed in the patent applications, it is possible to form the polycrystalline thin film consisting of the crystal structure of a C-type rare earth oxide, such as $Y_2O_3$ or the like, having a superior crystal orientation wherein the grain boundary inclination angle is controlled to within 30° or less. This technology is disclosed in the filed Japanese Patent Application, First Publication No. 2001-114594.

While this patent application reported about a polycrystalline thin film consisting of mainly $Y_2O_3$, the possibility of polycrystalline thin films having different C-type rare earth oxide crystal structures was only pointed out. Thus, with respect to the polycrystalline thin films having each of the types of the C-type rare earth oxide crystal structures described above, further research would be required to discover what production conditions have a significant influence on the crystal orientation properties thereof.

The technology for forming various types of well-oriented films on a polycrystalline substrate has also been widely used outside the field of application of the oxide superconducting elements described above. For example, it is used in the fields of optical thin films, magneto-optical disks, circuit wiring boards, high-frequency waveguides, high-frequency filters, and cavity resonators. In all of these technologies as well, forming well-oriented polycrystalline thin films having a stable film quality on a substrate using these technologies remains a difficult task. That is, even more preferably, improved crystal orientation properties of a polycrystalline thin film would be advantageous if utilized with the optical thin film, magnetic thin film, circuit film or the like formed directly thereon.

The present invention has an object of providing a production method for a polycrystalline thin film. The present invention was completed as a result of numerous studies in which a polycrystalline thin film having the crystal structure of a C-type rare earth oxide with a good crystal orientation was formed on a polycrystalline substrate by applying the ion beam assist previously provided by the inventor. Among the polycrystalline thin films having the crystal structure of the C-type rare earth oxide described above, specifically, the polycrystalline thin films having the crystal structure of C-type rare earth oxides represented by the formulas for the six types: $Sm_2O_3$, $Gd_2O_3$, $Y_2O_3$, $Ho_2O_3$, $Er_2O_3$, and $Yb_2O_3$, materials having a good crystal orientation were chosen from among these six by forming films while varying the assisting ion beam energy applied when the polycrystalline thin film was formed and varying the temperature of the polycrystalline substrate on which the polycrystalline thin film was deposited. Among the production methods for polycrystalline thin films, changes in ion beam energy and temperature are thought to influence the crystal orientation properties significantly. Thereby, the favorable production conditions for these selected materials were discovered.

In addition, another object is to provide a production method for an oxide superconducting element that provides a polycrystalline thin film formed after determining the advantageous ion beam energy and the temperature for the polycrystalline substrate, and providing an oxide superconducting layer that provides an oxide superconducting element layer having a superior crystal orientation on this polycrystalline thin film.

SUMMARY OF THE INVENTION

The production method for a polycrystalline thin film according to the present invention is a method for producing a polycrystalline thin film that comprises crystal grains of an oxide having a rare earth C-type crystal structure represented by the formula $Yb_2O_3$ formed on the film-forming surface of a polycrystalline substrate, and that has grain boundary inclination angles, formed between the same crystal axes of the crystal grains along the plane parallel to the film forming surface of the polycrystalline substrate, that are controlled to within 30°. When depositing the grains that are emitted from the target consisting of the constituent elements of the polycrystalline thin film, the temperature of the polycrystalline substrate is set within a range of 150° C. to 250° C. (not less than 150° C. and not more than 250° C.). A $Kr^+$ ion beam, $Xe^+$ ion beam, or a mixed ion beam is used as the ion beam that emits the ion source. The ion beam energy of the ion beam is adjusted within a range of 175 to 225 eV (not less than 175 eV and not more than 225 eV), and the constituent grains are deposited on the substrate while the ion beam is irradiated at an angle of incidence of 50° to 60° (not less than 50° and not more than 60°) with respect to the normal of the film forming surface of the substrate.

In addition, the production method for an oxide superconducting element according to the present invention is a method for producing an oxide superconducting element that comprises a polycrystalline substrate, a polycrystalline thin film comprising crystal grains of an oxide that has the crystal structure of a C-type rare earth oxide represented by the formula $Yb_2O_3$ formed on the film forming surface of this polycrystalline substrate, and that has grain boundary inclination angles, formed between the same crystal axes of the crystal grains along the plane parallel to the film forming surface of the polycrystalline substrate, that are controlled to within 30°, and an oxide superconducting layer formed on this polycrystalline thin film. When depositing the constituent grains that are emitted from the target consisting of the constituent elements of the polycrystalline thin film, the temperature of the polycrystalline substrate is set within a range of 150° C. to 250° C. A $Kr^+$ ion beam, $Xe^+$ ion beam, or a mixed ion beam is used as the ion beam that emits the ion source. The ion beam energy of the ion beam is adjusted within a range of 175 eV to 225 eV, and the constituent grains are deposited on the substrate while the ion beam is irradiated at an angle of incidence of 50° to 60° with respect to the normal of the film forming surface of the substrate. After this, an oxide superconducting layer is formed on the polycrystalline thin film.

Providing an oxide superconducting layer on a polycrystalline thin film having the crystal structure of a C-type rare earth oxide such as $Yb_2O_3$ formed on a polycrystalline substrate is more advantageous than a polycrystalline thin film consisting of conventional YSZ with respect to the points described below.

The first point that can be made is that the difference between the distance between the nearest atoms of the oxide superconducting layer having a $YBa_2Cu_3O_{7-x}$ ($0<X<0.5$) composition as the upper layer is smaller for the $Yb_2O_3$ crystal than the YSZ crystal. Here, in the case of a face centered cubic lattice, the distance between nearest atoms denotes the space between an atom positioned at the center of a face and an atom positioned at the corner of a face. Specifically, 2½ (the root of 2) of the distance between nearest atoms represents the lattice constant.

Concretely, the lattice constant of $ZrO_2$, which is the main constituent in the crystal of YSZ, is 5.14 Å and the distance between nearest atoms is 3.63 Å. In a crystal of $Yb_2O_3$, the lattice constant is 5.22 Å and the distance between nearest atoms is 3.69 Å. In contrast, in the oxide superconducting layer having a $YBa_2Cu_3O_{7-x}$ ($0<X<0.5$) composition, the lattice constant is 5.4 to 5.5 Å and the distance between nearest atoms is 3.90 Å.

As is clear from the above three numbers for the distance between nearest atoms of the film, it can be understood that in comparison to the crystal of YSZ, the crystal of $Yb_2O_3$ is more similar to the oxide superconducting layer having a $YBa_2Cu_3O_{7-x}$ ($0<X<0.5$) composition. Therefore, the polycrystalline thin film of $Yb_2O_3$ can be considered to be more advantageous than the polycrystalline thin film of YSZ in terms of the consistency of the crystal. In other words, when depositing the atoms of the polycrystalline thin film by carrying out the ion beam assist technique, it is thought that the ones whose distances between nearest atoms are similar will readily deposit atoms in a regular pattern.

The second point that can be made is that it is possible to limit the value of the full width at half maximum (FWHM), which corresponds to the grain boundary inclination angle of the polycrystalline thin film, to a small one.

Because the above $Yb_2O_3$ has the crystal structure of a C-type rare earth oxide, the present inventor identically produced polycrystalline thin films having the crystal structure of the C-type rare earth oxides represented by the five formulas: $Sm2O_3$, $Gd_2O_3$, $Y_2O_3$, $Ho_2O_3$, and $Er_2O_3$, instead of $Yb_2O_3$, and for each of the obtained polycrystalline thin films, carried out X-ray diffraction by the θ-2θ method using a CuKα line, and produced a pole figure. In addition, the values of the full width at half maximum (FWHM), which corresponds to the grain boundary inclination angle of each of the polycrystalline thin films, can be found from these pole figures. As a result, it is clear that among the six elements given above (Sm, Gd, Y, Ho, Er, and Yb), the value of the full width at half maximum (FWHM) can be suppressed to 20° or less only in the case of the polycrystalline thin film consisting of a crystal of $Yb_2O_3$, which has the largest atomic number and is an oxide of the element Yb having a large lattice energy density.

In particular, when depositing a polycrystalline thin film consisting of a crystal of $Yb_2O_3$ described above on a polycrystalline substrate, more preferably the temperature of the polycrystalline substrate is set within a range from 150° C. to 250° C. and the ion beam energy of the assisting ion beam is set within a range from 175 eV to 225 eV. Thereby, it is possible to maintain stably a value of the full width at half maximum (FWHM) in the polycrystalline thin film comprising a crystal of $Yb_2O_3$ equal to or below 20°.

The third point that can be made is that it is possible to avoid $BaZrO_3$, which tends to be generated due to the heat processing and heat dispersion during production, at the interface between the conventional polycrystalline thin film of YSZ and the oxide superconducting layer having a $YBa_2Cu_3O_{7-x}$ ($0<X<0.5$) composition provided thereon.

In the case that a polycrystalline thin film comprising a crystal of $Yb_2O_3$ is used instead of YSZ, the interface between the polycrystalline thin film of $Yb_2O_3$ and the oxide superconducting layer having a $YBa_2Cu_3O_{7-x}$ ($0<X<0.5$) component can be stably maintained in a state wherein the dispersion of elements does not occur even under heating conditions of about 700 to 800° C.

Therefore, according to the production method for an oxide superconducting element according to the present invention that uses a polycrystalline thin film comprising a crystal of $Yb_2O_3$ and that provides an oxide superconducting element having a $YBa_2Cu_3O_{7-x}$ ($0<X<0.5$) composition thereon, it is possible to avoid the influences due to heat processing during production that occur conventionally, and it becomes possible to form stably the oxide superconducting element providing a superior superconductivity at all times.

DESCRIPTION OF THE PREFERRED EMBODIMENTS

Below, an embodiment of the present invention will be explained with reference to the figures.

Figure 1:
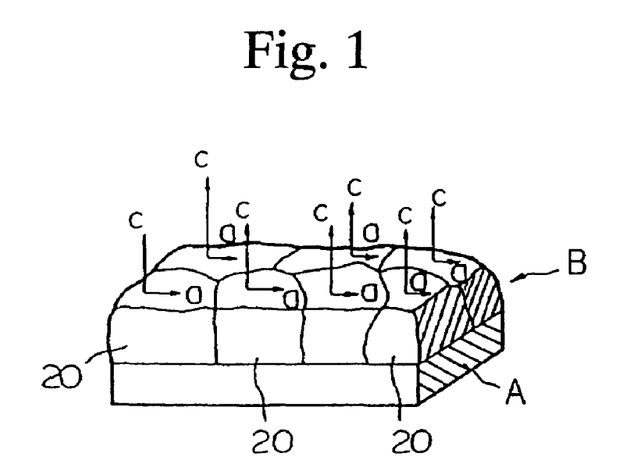
FIG. 1 is a schematic perspective drawing of a cross-section of a part of an example of a polycrystalline thin film according to the present invention.

FIG. 1 shows an embodiment according to the present invention in which a polycrystalline thin film is formed on a substrate. In FIG. 1, A denotes a tape-shaped polycrystalline substrate, and B denotes a polycrystalline thin film formed on the upper surface of the polycrystalline substrate A. The polycrystalline substrate A having a shape such as a board, a plate, a wire, a tape or the like, and consists of a material such as metal materials and alloys, including silver, platinum, stainless steel, copper, an Ni alloy such as Hastelloy, or various types of glass and various types of ceramics.

The microcrystal grains 20 of the polycrystalline thin film B of this embodiment, which comprise $Yb_2O_3$ having the crystal structure of a C-type rare earth oxide with an equiaxed grain structure, are bonded together via many crystal grain boundaries, the c-axis of the crystal axes of each of the crystal grains 20 projects at a right angle upward from the surface (the film forming surface) of the substrate A, and the a-axis and the b-axis of the crystal grains 20 are respectively oriented in-plane facing the same directions. In addition, the c-axis of each of the crystal grains 20 is oriented at a right angle with respect to the film forming surface that acts as the upper surface of the polycrystalline substrate A. The crystal grains 20 are bonded together so that angles between the a-axes thereof (the grain boundary inclination angle K shown in FIG. 2) are within 30°, for example, 25 to 30°.

Figure 3:
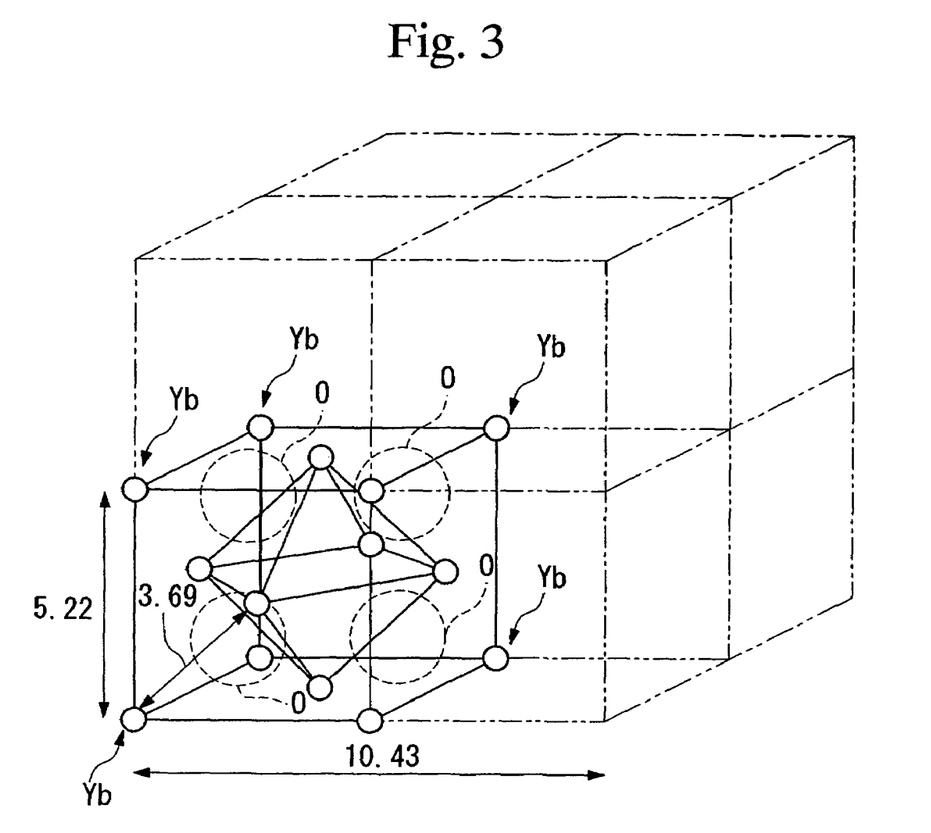
FIG. 3 is a conceptual drawing showing the crystal lattice of the polycrystalline thin film consisting of $Yb_2O_3$ according to the present invention.

The crystal lattice of the $Yb_2O_3$ is included among the C-type rare earth oxides, but the C-type rare earth oxides are derived from a cubic system fluorite structure, and as shown in FIG. 3, in the case of eight unit lattices having a face centered cubic structure aligned in a longitudinal direction and a transverse direction, the structure is one in which only one of the oxygen atoms 0 that are entrained in the lattice space formed by the Yb atoms is missing. Thus, because eight overlaid lattices of the $Yb_2O_3$ serve as a unit cell in the field of X-ray analysis, even though the lattice constant as a unit cell is 10.43 Å, the width of the lattice as a unit lattice is 5.22 Å, and the distance between nearest atoms (also referred to as the distance between most adjacent atoms) is 3.69 Å.

What is important when depositing this unit lattice of $Yb_2O_3$ using an ion beam assist technique under the conditions described below is the distance between nearest atoms of 3.69 Å, and preferably, when choosing between the lattice constant of 5.4 to 5.5 Å and the distance between nearest atoms of 3.90 Å of the oxide superconducting layer having a $YBa_2Cu_3O_{7-x}$ (0<X<0.5) component, this value should in particular be chosen close to the distance between nearest atoms of 3.90 Å. The difference in the distance between the nearest atoms for the oxide superconducting layer having a $YBa_2Cu_3O_{7-x}$ (0<X<0.5) component is only about 5% (distance between nearest atoms: 3.69 Å) in the case of $Yb_2O_3$, while it reaches about 7% (distance between nearest atoms: 3.63 Å) in the case of YSZ.

Examples of a rare earth oxide C-type oxides other than $Yb_2O_3$ are shown in Table 1, where the numerical values of $Yb_2O_3$ are listed for comparison.

TABLE 1

| Number | Oxide name | Lattice constant (Å) as unit cell | Distance between nearest atoms (Å) |
|---|---|---|---|
| 1 | $Sc_2O_3$ | 9.84 | 3.48 |
| 2 | $Nd_2O_3$ | 11.08 | 3.92 |
| 3 | $Sm_2O_3$ | 10.97 | 3.86 |
| 4 | $Eu_2O_3$ | 10.87 | 3.84 |
| 5 | $Gd_2O_3$ | 10.81 | 3.82 |
| 6 | $Tb_2O_3$ | 10.73 | 3.79 |
| 7 | $Dy_2O_3$ | 10.67 | 3.77 |
| 8 | $Y_2O_3$ | 10.60 | 3.75 |
| 9 | $Ho_2O_3$ | 10.61 | 3.75 |
| 10 | $Er_2O_3$ | 10.55 | 3.73 |
| 11 | $Yb_2O_3$ | 10.43 | 3.69 |
| 12 | $Lu_2O_3$ | 10.39 | 3.67 |

Polycrystalline thin films consisting of the six types of oxides indicated by numbers 3, 5, 8, 9, 10, and 11 were produced and the values of the full width at half maximum (FWHM), which corresponds to the grain boundary inclination angle in each of the polycrystalline thin films, were examined. Here, the polycrystalline thin films were formed by varying two of the production conditions, specifically, the temperature of the polycrystalline substrate when depositing the polycrystalline thin film on the polycrystalline substrate and the ion beam energy of the assist ion beam.

Table 2 shows both the full width at half maximum (degrees) of the polycrystalline thin films consisting of the six types of oxides described above and the two production conditions (the temperature (C°) of the polycrystalline substrate and the ion beam energy (eV)) when these values were obtained. In addition, the lattice constant (C/nm) of each of the oxides, the lattice energy (E/kj·mol$^{-1}$), and the lattice energy density (eV·nm$^{-3}$) are also listed. Moreover, the results of Table 2 were found within a temperature range of 100° C. to 500° C., using an Ar$^+$ ion beam as the assist ion and varying the ion beam energy within a range of 150 eV to 300 eV.

TABLE 2

| Number | Name of Oxide | Lattice Constant | Lattice Energy | Lattice Energy Density | Full Width at Half Maximum | Temperature of Substrate | Ion Beam Energy |
|---|---|---|---|---|---|---|---|
| 3 | $Sm_2O_3$ | 1.093 | 13181 | 1677 | Random | — | — |
| 5 | $Gd_2O_3$ | 1.081 | 13330 | 1753 | Random | — | — |
| 8 | $Y_2O_3$ | 1.060 | 13428 | 1873 | 24.5 | 300 | 150 |
| 9 | $Ho_2O_3$ | 1.061 | 13538 | 1890 | Some Order | 300 | 150 |
| 10 | $Er_2O_3$ | 1.055 | 13665 | 1934 | 37.7 | 300 | 150 |
| 11 | $Yb_2O_3$ | 1.043 | 13814 | 2023 | 17.3 | 200 | 200 |

From Table 2, among the six elements listed above (Sm, Gd, Y, Ho, Er, and Yb), it is clear that the value of the full width at half maximum (FWHM) can be limited to 20° or lower only in the case of the polycrystalline thin film consisting of crystals of $Yb_2O_3$, which has the largest atomic number and is an oxide of the element Yb having a large lattice energy density.

Below, a production method for the polycrystalline thin film B according to the embodiment of the present invention used for obtaining the results in Table 2 and an apparatus suitable for this production will be explained.

Figure 4:
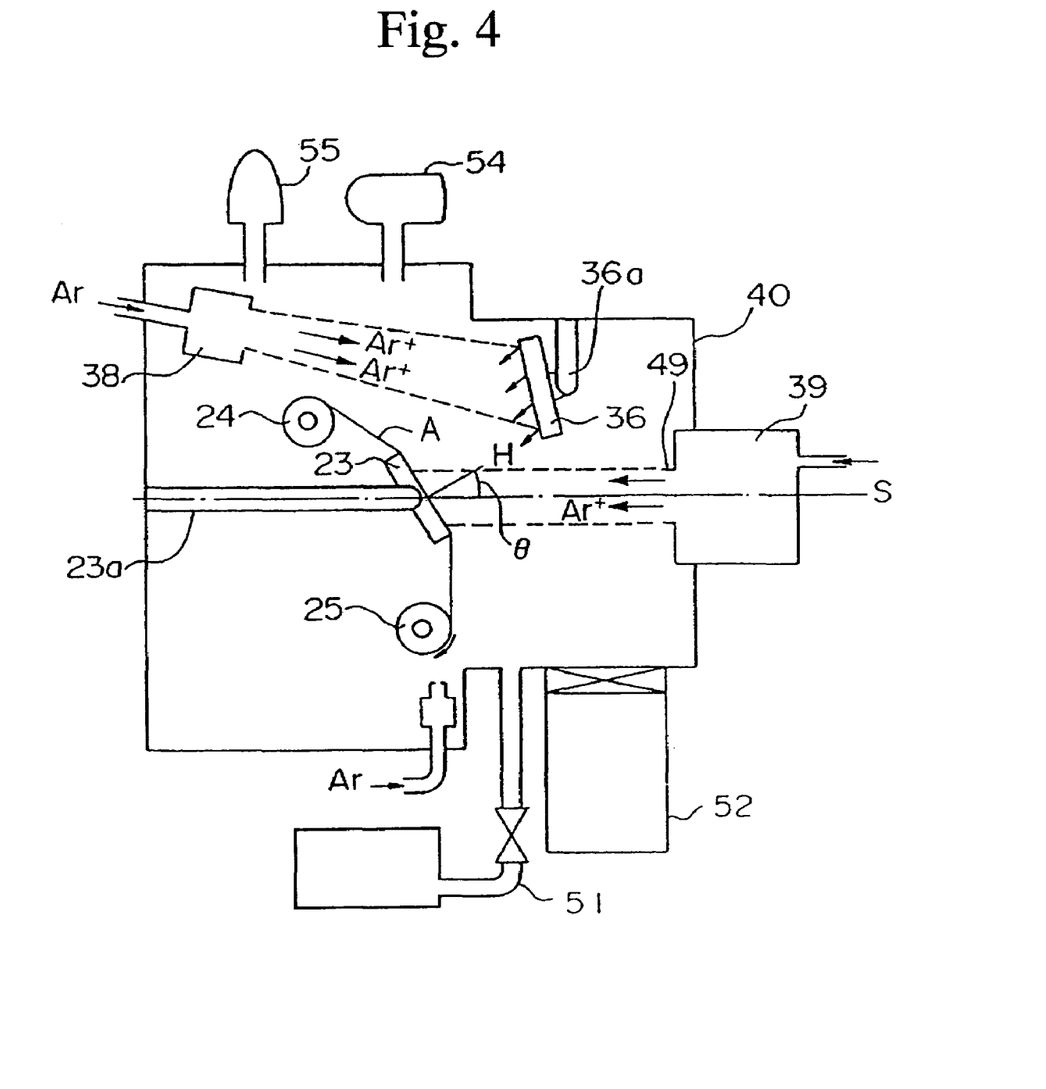
FIG. 4 is a schematic structural drawing showing an example of the apparatus that produces the polycrystalline thin film according to the present invention.

FIG. 4 shows an example of an apparatus for producing the polycrystalline thin film B described above, and the apparatus in this example has a structure that provides an ion source for an ion beam assist in a sputter apparatus.

The apparatus in this example is structured so as to accommodate in a film forming processing container that can be evacuated, a substrate holder 23 that can support a tape-shaped polycrystalline substrate A and can be heated to a desired temperature; a substrate feed reel 24 for feeding the tape-shaped polycrystalline substrate A onto the substrate holder 23; a substrate take-up reel 25 that can take up the tape-shaped polycrystalline substrate A on which the polycrystalline thin film is formed; a plate-shaped target 36 disposed opposite to and above the substrate holder 23 at an inclination and a predetermined distance; a sputter beam irradiation apparatus (sputter device) 38 disposed above this target 36 at an inclination facing the bottom surface of the target 36; and an ion source 39 disposed opposite to the substrate holder 23 side at a predetermined distance and separated from this target 36.

The substrate holder 23 provides a heater therein, and as necessary can heat the tape-shaped polycrystalline substrate A fed over the substrate holder 23 to a desired temperature. This substrate holder 23 is mounted so as to be able to rotate freely on the support body 23a by a pin or the like, and thus has an adjustable angle of inclination. Such a substrate holder 23 is installed in the optimal irradiation region of the ion beam that irradiates from the ion source 39 in a film forming processing chamber 40.

In the production apparatus for the polycrystalline thin film in this example, the tape-shaped polycrystalline substrate A is continuously fed over the substrate 23 from the substrate feed reel 24, and the polycrystalline substrate A on which the polycrystalline thin film is formed in the optimal irradiation region is taken up by the substrate take-up reel 25. Thereby, film formation can be carried out continuously on the polycrystalline substrate A. This substrate take-up reel 25 is provided outside the optimal irradiation region.

The target 36 is the base material for forming the target polycrystalline thin film, and uses a composition identical to or similar to the composition of the target polycrystalline thin film. Concretely, as a target 36, a target consisting of any of the complex oxides represented by the formulas $Sm_2O_3$, $Gd_2O_3$, $Y_2O_3$, $Ho_2O_3$, $Er_2O_3$, or $Yb_2O_3$ can be used, or a target having a composition that incorporates beforehand a large amount of one element among the two constituent elements of each that is readily scattered when being made into a film can be used. Such a target 36 is installed on the target support body 36a that is held by a pin or the like so as to be able to freely rotate, and thus has an adjustable angle of inclination.

The sputter beam irradiation apparatus 38 is structured so as to accommodate a vaporization source in a chamber, and provides a grid for applying an extraction voltage in proximity to the vaporization source. A portion of the atoms or molecules generated by the vaporization source are ionized and irradiated as an ion beam by controlling these ionized particles using the electric field generated by the grid. In order to ionize the particles, a direct current discharge method, a frequency excitation method, a filament method, a cluster ion beam method or the like can be used. The filament method generates thermions by heat due to a current flowing through a tungsten filament and vaporized particles are ionized in a high vacuum due to colliding with the thermions.

In the cluster ion beam method, clusters of aggregated molecules are discharged into a vacuum from a nozzle provided on the opening of a crucible in which a raw material is placed, and the clusters are ionized and emitted by colliding with the thermions.

Figure 5A:
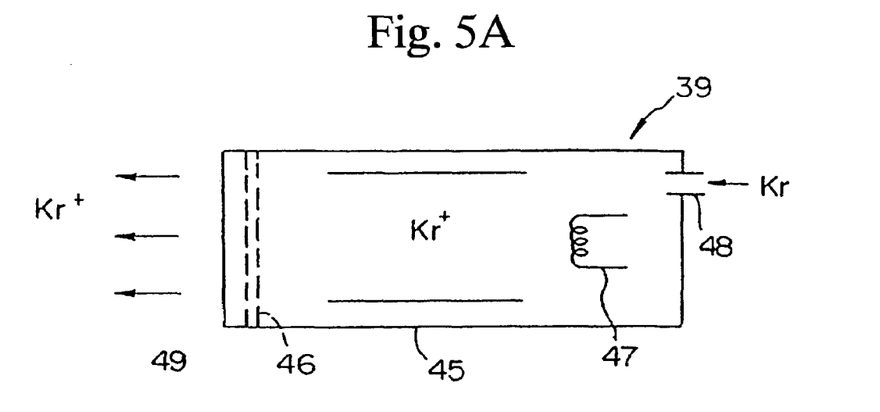
FIG. 5A is a structural drawing showing an example of the ion source that forms the apparatus shown in FIG. 4.

In the production apparatus for the polycrystalline thin film of this embodiment, the ion source 39 having the internal structure shown in FIG. 5A is used. This ion source 39 provides a grid 46 inside the tubular ion chamber 45, a filament 47, and an introduction tube 48 for Ar gas, Kr gas, Xe gas or the like, and can emit ions from the beam opening 49 at the distal end of the ion chamber 45 in a substantially parallel beam.

As shown in FIG. 4, the center axis S of the ion source 39 faces the upper surface (the film forming surface) of the polycrystalline substrate A at an inclination having an angle of incidence θ (the angle formed by the perpendicular line H (the normal line) that is perpendicular to the film forming surface (the upper surface) of the polycrystalline substrate A and the center line S). Preferably this incident angle θ is within a range of 50 to 60°, more preferably within a range of 55 to 60°, and most preferably about 55°. Therefore, the ion source 39 is disposed such that the ion beam irradiates at an incident angle θ with respect to the normal H of the film forming surface of the polycrystalline substrate A. Moreover, it is possible to use an ion beam of Ar gas, an ion beam of Kr gas, an ion beam of Xe gas, or a mixed ion beam of Ar gas and Kr gas as the ion beam that irradiates the polycrystalline substrate A by this ion source.

In addition, an atmospheric gas supply source such as a rotary pump 51, a cryo-pump 52, and a gas tank or the like, for evacuating the inside of the chamber 40 to a low pressure state such as a vacuum, are each connected to the film forming processing chamber 40, and thereby it is possible to evacuate the film forming processing chamber 40 to a low pressure state, such as a vacuum, and provide it with an Ar gas or another inert gas environment. Furthermore, a current density measuring apparatus 54 for measuring the current density of the ion beam inside the chamber 40 and a pressure meter 55 for measuring the pressure inside the chamber 40 are mounted in the film forming processing chamber 40. In this example of the production apparatus for a polycrystalline thin film, by installing a substrate holder 23 so as to be able to rotate freely on a support body 23a such as a pin, it is possible to adjust the angle of inclination of the polycrystalline substrate 23 with respect to the target 36 and the ion source 39, but it is also possible instead to adjust the angle of inclination of the ion beam 39 or adjust the angle of incidence of the ion beam that irradiates the polycrystalline substrate A. In addition, an angle adjusting mechanism is not limited to these examples, and of course it is possible to employ various compositions.

Below, the method of producing a polycrystalline thin film B consisting of $Yb_2O_3$ according to the present invention using the apparatus having the structure described above will be explained.

In order to form the polycrystalline thin film on the tape-shaped polycrystalline substrate A, a target 36 consisting of $Yb_2O_3$ is used, and the inside of the film forming processing chamber 40 that accommodates the polycrystalline substrate A is evacuated to a low pressure atmosphere. At the same time, the polycrystalline substrate A is fed at a predetermined speed from the substrate feed reel 24 to the substrate holder 23, and then the ion source 39 and the sputter beam irradiating apparatus 38 are activated.

When the ion beam from the sputter beam irradiating apparatus 38 irradiates the target 36, the constituent particles of the target 36 are ejected and projected to the polycrystalline substrate A. In addition, while the constituent particles that are ejected from the target 36 are being deposited on the polycrystalline substrate A that is fed onto the substrate holder 23, simultaneously an ion beam of $Ar^+$ ions, an ion beam of $Kr^+$ ions, an ion beam of $Xe^+$ ions, an mixed ion beam of $Kr^+$ ions and $Xe^+$ ions, or the like is irradiated from the ion source 39. Thereby, a polycrystalline thin film having a desired thickness is formed, and after film formation, the tape-shaped polycrystalline substrate A is taken up on the substrate take-up reel 25.

Here, the angle of incidence θ when irradiating the ion beam is preferably within a range from 50 to 60°, more preferably within a range between 55 and 60°, and most preferably about 55°. Here, when θ is 90°, the c-axes of the polycrystalline thin film consisting of $Yb_2O_3$ do not align. In addition, when θ is 30°, the c-axes of the polycrystalline thin film consisting of $Yb_2O_3$ do not align. If the ion beam irradiation is carried out at the angle of incidence in the preferable ranges described above, the c-axes of the crystal of the polycrystalline thin film consisting of $Yb_2O_3$ stand perpendicular with respect to the film forming surface of the polycrystalline substrate A. If the ion beam irradiation is carried out at such an angle of incidence while sputtering is carried out, the a-axes and the b-axes of the crystal axes of the polycrystalline thin film consisting of $Yb_2O_3$ formed on the polycrystalline substrate A are oriented with respect to each other in an identical direction, and are oriented in-plane along the plane parallel to the upper surface (film formation surface) of the polycrystalline substrate A.

When forming the polycrystalline thin film consisting of $Yb_2O_3$ according to the present invention, it is further necessary to keep the temperature of the polycrystalline substrate A and the ion beam energy of the assist ion beam within a predetermined range.

First, the results of fixing the ion beam energy at 200 eV, varying the temperature of the polycrystalline substrate A within the range of 100° C. to 300° C., forming a polycrystalline thin film consisting of $Yb_2O_3$ on the polycrystalline substrate A, and then examining the full width at half maximum (FWHM) of the obtained polycrystalline thin film will be described.

Figure 9:
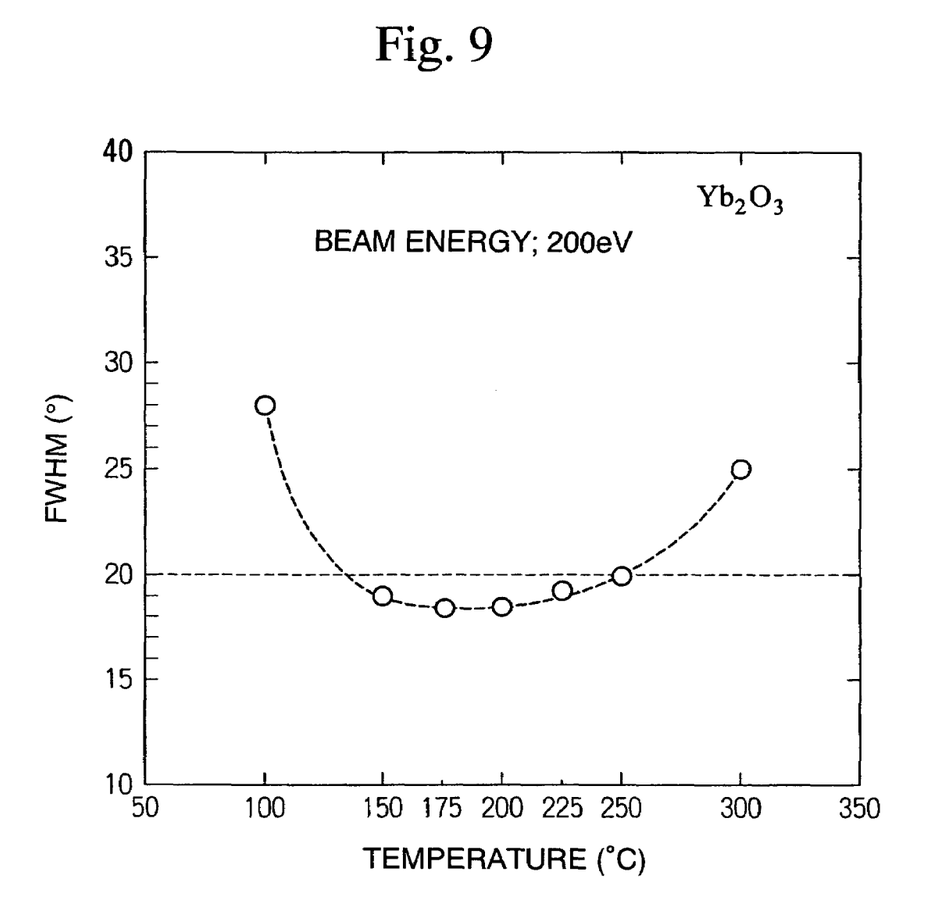
FIG. 9 is a graph showing the relationship between the temperature of the polycrystalline substrate and the full width at half maximum of the formed polycrystalline thin film.

FIG. 9 is a graph showing the relationship between the temperature of the polycrystalline substrate A and the full width at half maximum of the obtained polycrystalline thin film when the polycrystalline thin film consisting of $Yb_2O_3$ was formed on the polycrystalline substrate A. From the results of FIG. 9, it can be understood that the value of the full width at half maximum of the polycrystalline thin film is dependent on the temperature of the polycrystalline substrate A, and irrespective of whether the temperature is too high or too low, there is a tendency for the full width at half maximum to increase. In particular, it was discovered that if the polycrystalline thin film is formed on the polycrystalline substrate A when the temperature of the polycrystalline substrate A is within a range from 150° C. to 250° C., it is possible to suppress the value of the full width at half maximum of the polycrystalline thin film to 20° or less, and thus a polycrystalline thin film providing a good crystal orientation can be produced stably. Within this range, a temperature range of 175° C. to 200° C. is more preferable.

Next, the results of fixing the temperature of the polycrystalline substrate A at 200° C., varying the ion beam energy within the range of 100 eV to 300 eV, forming a polycrystalline thin film consisting of $Yb_2O_3$ on the polycrystalline substrate A, and then examining the full width at half maximum (FWHM) of the obtained polycrystalline thin film will be described.

Figure 10:
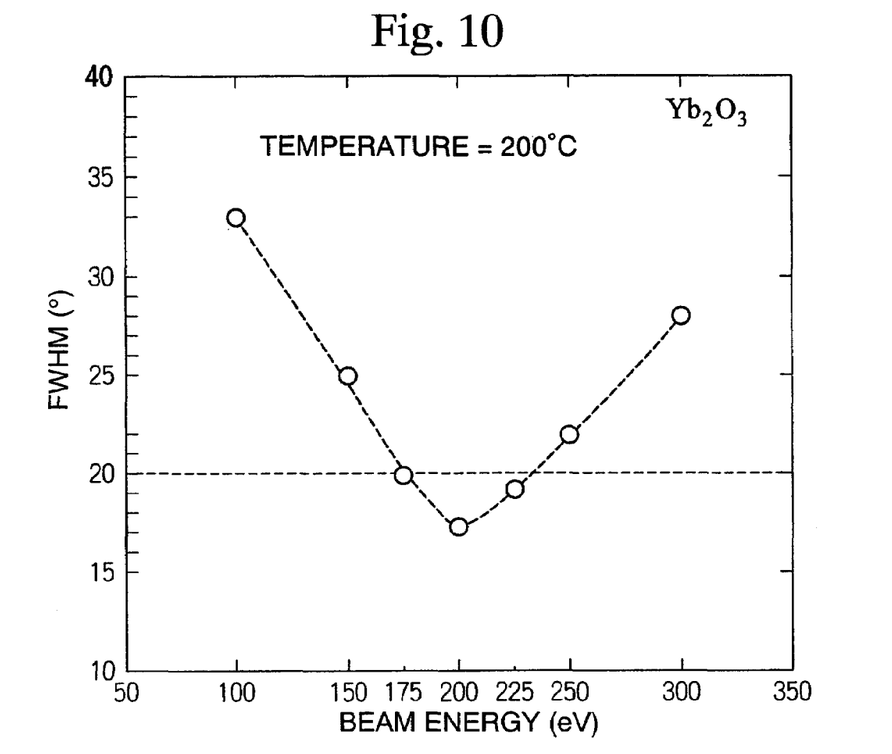
FIG. 10 is a graph showing the relationship between the ion beam energy and the full width at half maximum of the formed polycrystalline thin film.

FIG. 10 is a graph showing the relationship between the ion beam energy and the full width at half maximum of the obtained polycrystalline thin film when the polycrystalline thin film consisting of $Yb_2O_3$ is formed on the polycrystalline substrate A. From the results of FIG. 10, the value of the full width at half maximum of the polycrystalline thin film is strongly dependent on the ion beam energy, and in order to establish a full width at half maximum equal to or less than 20°, limiting the ion beam energy to a particular range, specifically, a range from 175 eV to 225 eV, is effective. Within this range, an ion beam energy of about 200 eV is preferable. In the case that the ion beam energy is equal to or less than 150 eV, the full width at half maximum of the polycrystalline thin film increases along with the decrease in the ion beam energy. In contrast, it has been confirmed that when the ion beam energy is equal or greater than 250 eV, the full width at half maximum of the polycrystalline thin film to tends to increase along with the increase in the ion beam energy. Therefore, in order to form a polycrystalline thin film providing good crystal orientation with a full width at half maximum equal to or less than 20°, it is desirable to use an ion beam energy within a range of 175 eV to 225 eV.

Figure 2:
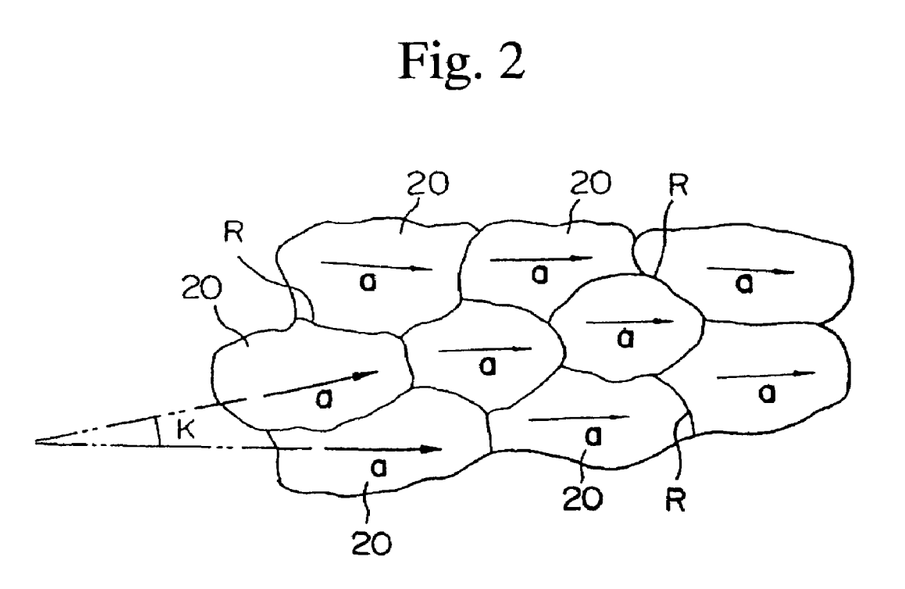
FIG. 2 is an expanded plane view showing the crystal grains of the polycrystalline thin film shown in FIG. 1, and the crystal axis direction and the grain boundary inclination angle of the crystal thereof.

By forming a film on the polycrystalline substrate A using an ion assist method having a temperature and ion beam energy within the ranges described above, it is then possible to form the polycrystalline thin film B consisting of the C-type rare earth oxide $Yb_2O_3$ that has good orientation properties. FIG. 1 and FIG. 2 show a polycrystalline substrate A on which the polycrystalline thin film B consisting of $Yb_2O_3$ is deposited using the method described above. Moreover, FIG. 1 shows the state in which only one layer of crystal grains 20 is formed, but of course the crystal grains may have a multiple layer structure.

Figure 5B:
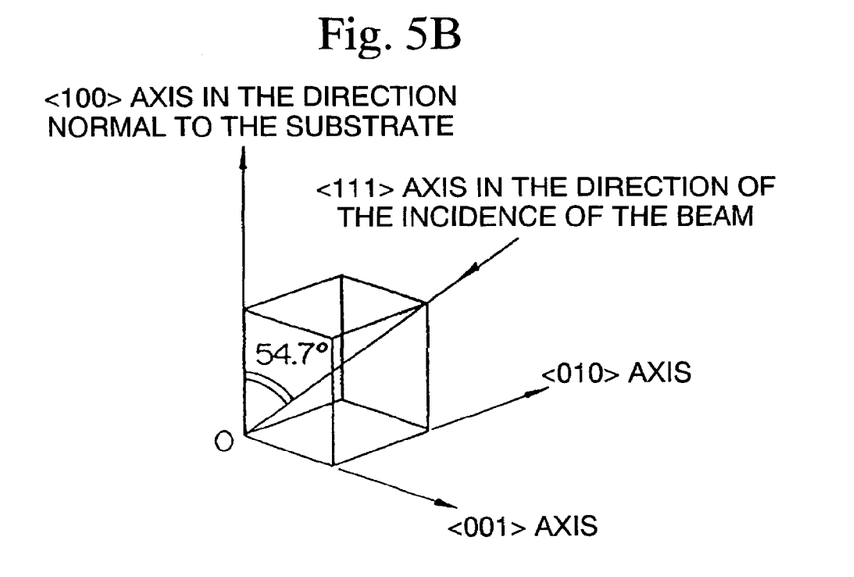
FIG. 5B is an explanatory drawing related to the angle of incidence of the ion beam.

The inventor supposes the following are important factors in aligning the crystal orientation of the polycrystalline thin film B. As shown in FIG. 5B, the unit lattice of the crystal of the polycrystalline thin film B consisting of $Yb_2O_3$ has an equiaxed face centered cubic C-type rare earth oxide structure, and in this crystal lattice, the normal direction of the substrate is the <100> axis, and the other <010> axis and the <001> axis have the directions shown in FIG. 5B. When considering the ion beam incident from an inclined direction with respect to the normal of the substrate in terms of these directions, the angle of incidence becomes 54.7° when the ion beam is incident in the direction of the diagonal line of the unit lattice with respect to the origin O in FIG. 5B, that is, along the <111> axis. Here, exhibiting good crystal orientation properties in the 50 to 60° range for the angle of incidence as described above assumes that the ion channeling occurs most effectively when the angle of incidence of the ion beam is equal to or substantially equal to 54.7°. In the crystal deposited on the polycrystalline substrate A, only the stable atoms having a distribution relationship that conforms to this angle on the upper surface of the polycrystalline A are readily selectively retained, while the unstable atoms in other irregular atomic arrays are eliminated by sputtering due to the sputtering effect of the ion beam. As a result, only crystals that are aggregates of well-oriented atoms selectively remain and are deposited. With respect to the ion beam sputter effect that accompanies this ion beam channeling, an ion beam of $Ar^+$ ions, an ion beam of $Kr^+$ ions, an ion beam or $Xe^+$ ions, or a mixed ion beam of $Ar^+$ and $Kr^+$ is effective for the polycrystalline thin film consisting of $Yb_2O_3$ that is to be formed. Even if formation of the polycrystalline thin film B consisting of $Yb_2O_3$ is carried out under the conditions described above, when the temperature of the polycrystalline substrate A during film formation and the energy of the beam during the ion beam assist are not set within the range described above, a good ion beam channeling effect is not attained. Thus, the film formation must be carried out in conformity with all three prescribed conditions described above: the ion beam assist angle, the temperature of the polycrystalline substrate A, and the ion beam energy.

Figure 6:
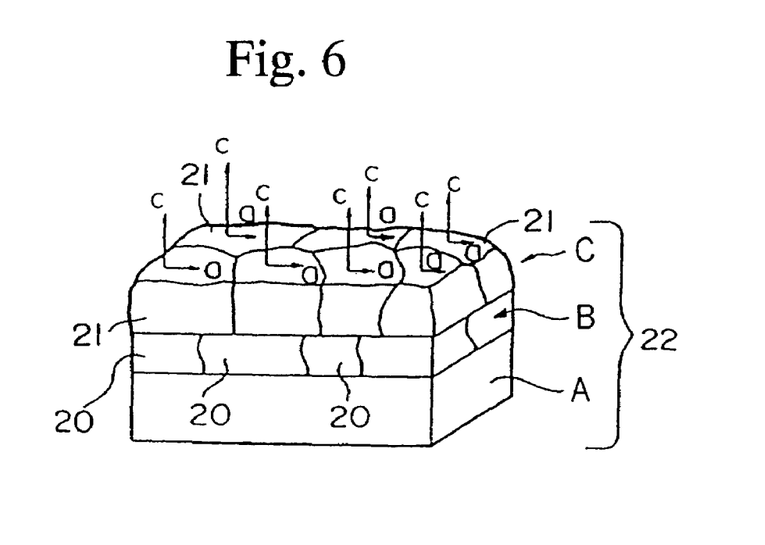
FIG. 6 is a schematic structural drawing showing the oxide superconducting layer formed on the polycrystalline thin film shown in FIG. 1.
Figure 7:
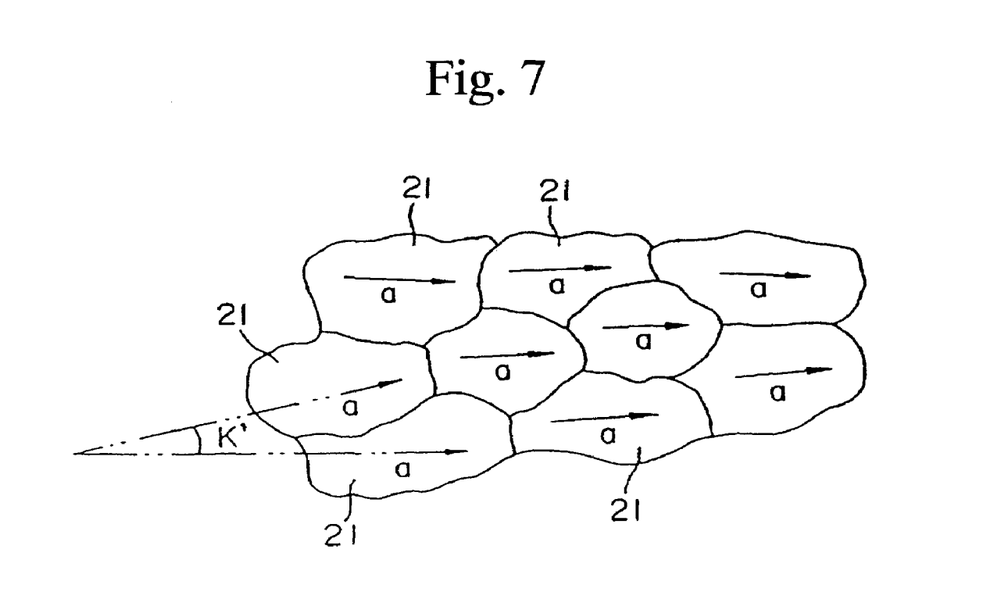
FIG. 7 is an expanded plane view of the crystal grain of the oxide polycrystalline thin film shown in FIG. 6 and the crystal axis direction and grain boundary inclination angle of the crystal thereof.

FIG. 6 and FIG. 7 show an embodiment of the oxide superconducting element according to the present invention. The oxide superconducting element 22 of this embodiment comprises a flat polycrystalline substrate A, a polycrystalline thin film B formed on the upper surface of this polycrystalline substrate A, and an oxide superconducting layer C formed on the upper surface of this polycrystalline thin film B. The polycrystalline substrate A and the polycrystalline thin film B are formed from materials identical to those that have been explained in the previous examples, and as shown in FIG. 1 and FIG. 2, the crystal grains 20 of the polycrystalline thin film B have a crystal orientation such that the grain boundary inclination angle is 30° or less, and more preferably, 25 to 30°.

Next, the oxide superconducting layer C covers the upper surface of the polycrystalline thin film B consisting of $Yb_2O_3$, the c-axis of the crystal grains thereof are oriented perpendicularly to the upper surface of the polycrystalline thin film B, the a-axis and the b-axis of the crystal grains 21 thereof are oriented in-plane along the surface parallel to the upper surface of the substrate similarly to the polycrystalline thin film B explained previously, and the grain boundary inclination angle K' that is formed between the crystal grains 21 is 30° or less. Oxide superconducting elements having a high critical temperature and represented by the compounds $YBa_2Cu_3O_{7-x}$ (0<X<0.5), and $YBa_2Cu_4O_8$, by the compounds $(Bi, Pb)_2Ca_2Sr_2Cu_3O_{10}$, or the compounds $Tl_2Ba_2Ca_2Cu_3O_{10}$, $Tl_1Ba_2Ca_2Cu_3O_9$, and $Tl_1Ba_2Ca_3Cu_4O_{11}$ are preferably used as the oxide superconducting element that forms the oxide superconducting layer, but of course other oxide superconducting elements besides these examples can be used.

The oxide superconducting layer C is formed on the polycrystalline thin film B explained previously, for example, by a film formation method such as sputtering or laser vaporization, the oxide superconducting layer C deposited on this polycrystalline thin film B is also deposited so as to conform to the orientation of the polycrystalline thin film B consisting of $Yb_2O_3$, and thereby the oxide superconducting layer formed on the polycrystalline thin film B has a superior quantum bonding at the crystal grain boundaries and almost no deterioration in the superconductive properties at the crystal grain boundaries. Thus, electricity flows readily in the lengthwise direction of the polycrystalline substrate A, and a sufficiently high critical current density is obtained that is substantially equal to that of the oxide superconducting layer obtained by being formed a single crystal substrate of MgO or $SrTiO_3$.

$Yb_2O_3$ is more preferable than YSZ as a constituent material for the polycrystalline thin film B, and thus rather than providing an oxide superconducting layer on a polycrystalline thin film consisting of YSZ, providing an oxide superconducting layer on a polycrystalline thin film consisting of $Yb_2O_3$ endures heat processing at high temperatures (700 to 800° C.), and furthermore, a superior critical current density equal to the case of providing the oxide superconducting layer on a polycrystalline thin film consisting of YSZ is shown. In the case that the film thickness becomes large, the rate of decrease of the critical current density is small even after having undergone temperature treatment such as heat treatment, and a superconducting element having a high critical current can be obtained.

The reason is attributed to the following.

First, as disclosed above, the point can be made that, in terms of distance between nearest atoms, the polycrystalline thin film comprising $Yb_2O_3$, whose distance between nearest atoms is more similar to the oxide superconducting layer than a polycrystalline thin film consisting of YSZ, is advantageous in terms of the alignment of the crystal.

Secondly, it is next understood from the investigations of the inventor that $BaZrO_3$ is readily generated at the interface between a polycrystalline thin film consisting of YSZ and an oxide superconducting layer consisting of $YBa_2Cu_3O_{7-x}$ (0<X<0.5) due to heat processing during production or thermal dispersion during heat processing. In contrast, the point can be made that the interface between a polycrystalline thin film consisting of $Yb_2O_3$ and an oxide superconducting layer consisting of $YBa_2Cu_3O_{7-x}$ (0<X<0.5) is stable under heating conditions from 700 to 800° C., and thus there is almost no occurrence of mutual diffusion of elements. In these terms as well, the polycrystalline thin film consisting of $Yb_2O_3$ is desirable.

Third, in the case of YSZ, a phase transition from a cubic crystal to an orthorhombic crystal occurs depending on the temperature. However, in the case of $Yb_2O_3$, the point can be made that this phase transition does not occur. In addition, the film formation should be able to occur sufficiently in terms of the bonding strength with the oxide atoms as well, and the burden on the apparatus is small.

Figure 8:
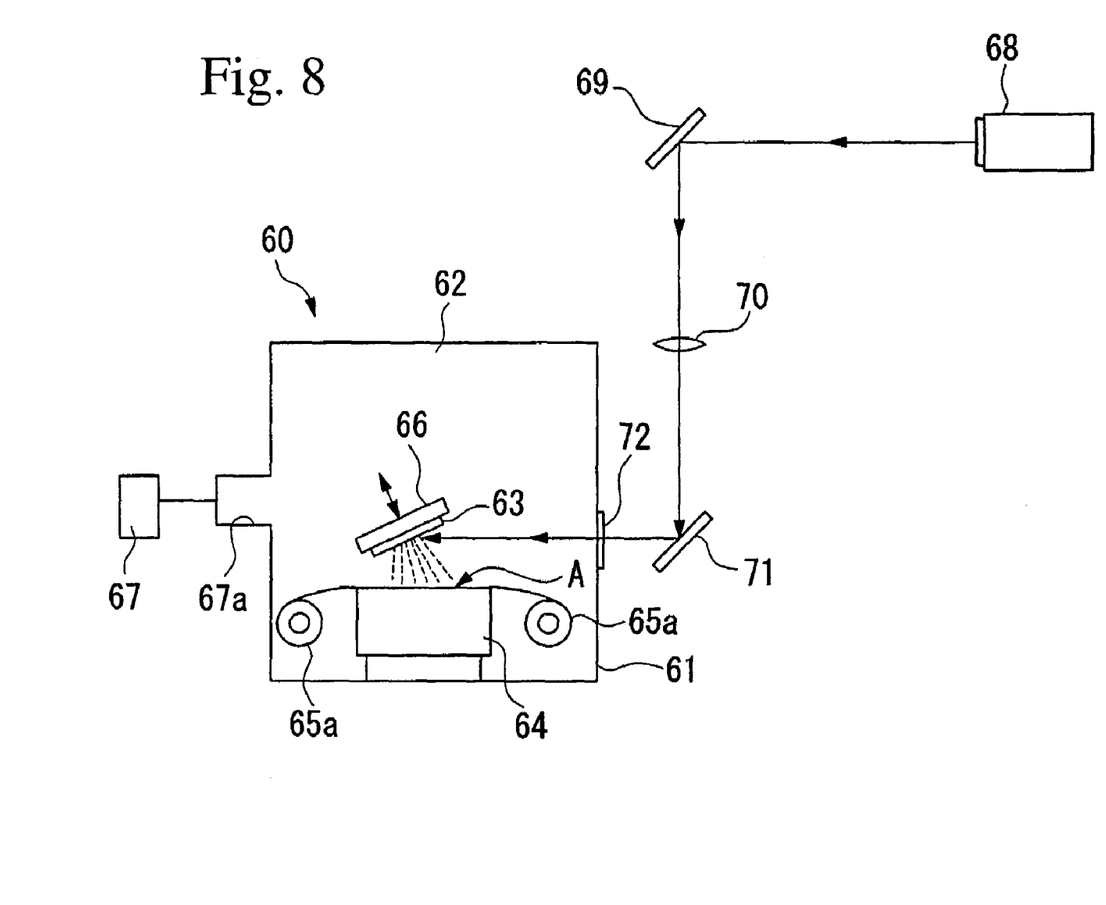
FIG. 8 is a schematic structural drawing showing an example of an apparatus for producing the oxide superconducting layer according to the present invention.

Below, an embodiment of an apparatus for forming the oxide superconducting layer C will be explained. FIG. 8 shows an example of an apparatus that forms an oxide superconducting layer using a vacuum deposition method. FIG. 8 shows a laser deposition apparatus. The laser deposition apparatus 60 in this example comprises a processing chamber 61, and a tape-shaped polycrystalline substrate A and a target 63 can be disposed in the deposition processing chamber 62 in this processing chamber 61. Specifically, a base 64 is provided at the bottom of the deposition processing chamber 62, and on the upper surface of this base 64 the polycrystalline substrate A is disposed in a horizontal state.

At the same time, the target 63, which is supported by the support holder 66 above the base 64 diagonally, is provided in a tilted state, the polycrystalline substrate A is feed onto the base 64 from the drum-shaped tape feed apparatus 65, and then it is taken up on the drum-shaped tape take-up apparatus 65*a*. In the processing chamber 61, an evacuation hole 67*a* communicates with the vacuum evacuation apparatus 67, and it is possible to decrease the pressure inside to a predetermined pressure.

The target 63 is a plate consisting of a composition identical to or similar to the oxide superconducting layer C that is to be formed, a sintered body of complex oxides that incorporate a lot of a constituent that escapes readily into the formed film, an oxide superconducting element, or the like. The base 64 has a heater built in, and thus it is possible to heat the polycrystalline substrate A to a predetermined temperature or maintain it at a predetermined temperature.

A laser emitting apparatus 68, a first reflecting mirror 69, a condenser lens 70, and a second reflecting mirror 71 are provided on the side of the processing chamber 61, and the laser beam emitted by the laser emitting apparatus 68 can be convergently radiated onto the target 63 via a transparent window 72 provided on the side wall of the processing chamber 61. The laser emitting apparatus 68 can cause constituent particles to be ejected from the target 63. In order for the laser emitting apparatus 68 to be able to cause the ejection of constituent particles from the target 63, a YAG laser, $CO_2$ laser, an excimer laser or the like should be used.

Next, the case in which an oxide superconducting layer C is formed on the polycrystalline thin film B consisting of YSZ will be explained. As stated above, after a polycrystalline thin film B consisting of $Yb_2O_3$ is formed on a polycrystalline substrate A, an oxide superconducting layer is formed on this polycrystalline thin film B. In this embodiment, the laser deposition apparatus 60 shown in FIG. 8 is used when an oxide superconducting layer is formed on a polycrystalline thin film B.

The polycrystalline substrate A on which the polycrystalline thin film B was formed is disposed above the base 64 of the laser deposition apparatus 60, and the pressure in deposition processing chamber 62 is lowered with a vacuum pump. Here, according to necessity, an oxide gas can be introduced into the deposition processing chamber 62, and thereby the deposition processing chamber 62 can be provided with an oxygen atmosphere. In addition, by activating the heater of the base 64, the polycrystalline substrate A can be heated to a desired temperature.

Next, the laser beam emitted from the laser deposition apparatus 68 is convergently radiated on the target 63 in the deposition processing chamber 62. Thereby, the constituent particles of the target 63 are ejected or vaporized and then these particles are deposited on the polycrystalline thin film B. Here, when depositing the constituent particles, because the c-axis is oriented in a vertical direction with respect to the already formed polycrystalline thin film B consisting of $Yb_2O_3$ and the a-axis and b-axis are oriented in a direction parallel to the film surface, crystallization occurs by epitaxial growth such that the c-axis, the a-axis, and the b-axis of the oxide superconducting layer C formed on the polycrystalline thin film B also align with the polycrystalline thin film B. Thereby, an oxide superconducting layer C having good crystal orientation properties is obtained.

The oxide superconducting layer C formed on the polycrystalline thin film B has a polycrystalline state, but in each of the crystal grains of this oxide superconducting layer C, as shown in FIG. 6, the c-axes, through which electricity flows with difficulty, are oriented in the thickness direction of the polycrystalline substrate A, and the a-axes and the b-axes both are oriented in the longitudinal direction of the polycrystalline substrate A. Therefore, the obtained oxide superconducting layer has superior quantum bonding at the crystal interfaces and little deterioration of the superconductive properties at the crystal interfaces, and thus the electricity flows readily in the direction of the surface of the polycrystalline substrate A, and a polycrystalline substrate A having a superior critical current density is obtained. In order to further stabilize the crystal orientation and the film quality of the oxide superconducting layer C, it is preferable to carry out a heat treatment in which the oxide superconducting layer C is heated for the necessary time at 700 to 800° C. and then cooled.

EXAMPLES

Using the producing apparatus for a polycrystalline thin film shown in FIG. 4, the pressure inside the film formation processing chamber of this production apparatus was reduced to $3.0 \times 10^{-4}$ Torr ($4 \times 10^{-2}$ Pa) by evacuation using a rotary pump and a cryo-pump. Hastelloy C276 tape having a width of 10 mm, a thickness of 0.5 mm, a length of 100 cm, and a mirror finished surface, was used as the tape-shaped substrate. A target consisting of $Yb_2O_3$ was used, the sputter voltage was set at 1000 V, the sputter current was set at 100 mA, and the angle of incidence of the $Kr^+$ ion beam emitted from the ion source was set at 55° with respect to the normal of the film forming surface. The travel distance of the ion beam was set at 40 cm, the sputter voltage of the ion beam was set to 150 eV, and the current density of the ion beam was set at 100 $\mu A/cm^2$. In addition, while the temperature of the substrate tape was set at 300° C. and oxygen flowed into the atmosphere at $1 \times 10^{-4}$ Torr ($1.3 \times 10^{-2}$ Pa), constituent particles of the target were deposited on the substrate, and simultaneously a polycrystalline thin film consisting of a film of $Yb_2O_3$ having a thickness of 1.0 μm was formed by irradiating an assist ion beam.

X-ray diffraction testing of the obtained polycrystalline thin film consisting of $Yb_2O_3$ was carried out with the θ-2θ method using a CuKα line, and the pole figure (not illustrated) based on the <200> direction of the $Yb_2O_3$ was obtained. Next, from the pole figure, it was confirmed that the obtained polycrystalline thin film consisting of $Yb_2O_3$ has good orientation properties. At the same time, it was ascertained that the grain boundary inclination angle of the polycrystalline thin film consisting of $Yb_2O_3$ was equal to or less than 20°.

Thus, the value of the full width at half maximum (FWHM) corresponding to the grain boundary inclination angle of the polycrystalline thin film consisting of $Yb_2O_3$ formed by varying the two film formation conditions that are assumed to influence the grain boundary inclination angle of the polycrystalline thin film consisting of $Yb_2O_3$, specifically, the temperature of the polycrystalline substrate A when producing the polycrystalline thin film B and the assist ion beam energy irradiated when producing the polycrystalline thin film B, were examined.

FIG. 9 is the result of forming the polycrystalline thin film consisting of $Yb_2O_3$ on this polycrystalline substrate A while varying the temperature of the polycrystalline substrate A from 100° C. to 300° C., and examining the full width at half maximum (FWHM) of the obtained polycrystalline thin film. Here, the ion beam energy was fixed at 200 eV.

From the results shown in FIG. 9, the following points became clear.

(1) The value of the full width at half maximum of the polycrystalline thin film consisting of $Yb_2O_3$ was dependent on the temperature of the polycrystalline substrate A, and in the case where the temperature was too low or two high, the full width at half maximum exhibited a tendency to increase.

(2) When the polycrystalline thin film B was formed on the polycrystalline substrate A while maintaining the temperature of the polycrystalline substrate A from 150 to 250° C., a polycrystalline thin film B having superior orientation properties, where the value of the full width at half maximum was equal to or less than 20°, was stably obtained.

(3) In particular, in the case that the temperature of the polycrystalline substrate A was within a range from 175 to 200° C., the value of the full width at half maximum was equal to or less that 19°, which is a further reduction of the value, and was therefore more preferable.

FIG. 10 is the result of forming the polycrystalline thin film consisting of $Yb_2O_3$ on this polycrystalline substrate A while varying the ion beam energy within a range from 100 to 300 eV, and examining the full width at half maximum (FWHM) of the obtained polycrystalline thin film. Here, the temperature of the polycrystalline substrate A was fixed at 200° C.

(4) The value of the full width at half maximum of the polycrystalline thin film was strongly dependent on the ion beam energy, and establishing the ion beam energy within a defined range, specifically, a range from 175 to 225 eV, was effective in order to establish the full width at half maximum equal to or less than 20°.

(5) Within this range, the value of the full width at half maximum of the polycrystalline thin film was the lowest when the ion beam energy was about 200 eV.

(6) In the case that the ion beam energy is weakened to 150 eV or less, the full width at half maximum of the polycrystalline thin film rapidly increased along with the decrease in the ion beam energy. Contrariwise, in the case that the ion beam energy is strengthened to 250 eV or more, the full width at half maximum of the polycrystalline thin film increased accompanying the increase in the ion beam energy.

From the experimental results in (1) through (6) described above, it is clear that in order to form a polycrystalline thin film consisting of $Yb_2O_3$ having a small full width at half maximum (FWHM) of 20° or less, corresponding to the grain boundary inclination angle, that is, in order to form a polycrystalline thin film consisting of $Yb_2O_3$ having a good crystal orientation, the temperature of the polycrystalline substrate A must be within a range from 150° C. to 250° C. during formation of the thin film, and at the same time, it is important that the assist ion beam energy during the formation of the thin film be within a range from 175 eV to 225 eV.

Next, the oxide superconducting layer C is formed on the polycrystalline thin film B consisting of $Yb_2O_3$ shown in FIG. 9 and FIG. 10 using the laser deposition apparatus shown in FIG. 8. At this time, a target consisting of an oxide superconducting element having a $YBa_2Cu_3O_{7-x}$ (0<X<0.5) component is used as the base material that is to form the oxide superconducting layer C. In addition, the pressure inside the vaporization processing chamber is reduced to $1\times10^{-6}$ Torr ($1.3\times10^{-4}$ Pa), the temperature of the polycrystalline substrate A on which the polycrystalline thin film B consisting of $Yb_2O_3$ is provided is brought to room temperature, and the oxide superconducting layer C is formed on this polycrystalline thin film B using a laser deposition method. An ArF laser having a wavelength of 193 nm is used as the laser for target vaporization. After formation of the oxide superconducting layer C, it is heat treated at 400° C. for 60 minutes in an oxygen atmosphere. Thereby, an oxide superconducting element having a width of 1.0 cm and a length of 100 cm is obtained.

Next, this oxide superconducting element was immersed in liquid nitrogen and the critical current density Jc ($A/cm^2$) was found for a part of the center portion of the oxide superconducting element, having a width of 10 mm and a length of 10 mm, using a four terminal method. Table 3 is the result of measuring the critical current density Jc of the obtained oxide superconducting element. Here, the horizontal column of Table 3 is the assist ion beam energy radiated when production the polycrystalline thin film B, and the vertical column in Table 3 is the temperature of the polycrystalline substrate A when producing the polycrystalline thin film B, where the results for the case that the temperature of the polycrystalline substrate A is 400° C. are also shown.

TABLE 3

| Temperature | Ion Beam Energy (eV) | | | | | | |
|---|---|---|---|---|---|---|---|
| (° C.) | 100 | 150 | 175 | 200 | 225 | 250 | 300 |
| 100 | — | — | — | 180000 | — | — | — |
| 150 | — | 220000 | 360000 | 420000 | 380000 | 300000 | — |
| 175 | — | 270000 | 380000 | 430000 | 400000 | 340000 | — |
| 200 | — | 320000 | 400000 | 450000 | 420000 | 400000 | — |
| 225 | — | 260000 | 370000 | 420000 | 390000 | 340000 | — |
| 250 | — | 220000 | 360000 | 400000 | 370000 | — | — |
| 300 | — | — | 190000 | 250000 | 210000 | — | — |
| 400 | — | — | 40000 | 80000 | 60000 | — | — |

The following points become clear from Table 3.

(7) The oxide superconducting element according to the present invention exhibit a maximum critical current density Jc exceeding 400,000 $A/cm^2$, and thus it is confirmed to provide superior superconducting properties.

(8) In particular, it is possible to suppress the value of the critical current density Jc to within 80% of its maximum value (equal to or greater than 360,000 $A/cm^2$) with an oxide superconducting element in which the oxide superconducting layer C is formed on the polycrystalline thin film B consisting of $Yb_2O_3$ that is formed when the temperature of the polycrystalline substrate A is within a range from 150° C. to 250° C. when the polycrystalline thin film is formed and the assist ion beam energy is within a range from 175 eV to 225 eV when the thin film is formed.

(9) Therefore, it is possible to realize stably an extremely high value for the critical current density Jc with an oxide superconducting element that forms the oxide superconducting layer C on the polycrystalline thin film B comprising $Yb_2O_3$ whose full width at half maximum (FWHM) value, which corresponds to the grain boundary inclination angle, is equal to or less than 20°.

According to the production method for a polycrystalline thin film according to the present invention, in the case of producing a polycrystalline thin film comprising crystal grains of oxide having a C-type rare earth oxide crystal structure represented by the formula $Yb_2O_3$ formed on the film forming surface of a polycrystalline substrate and the grain boundary inclination angle, which is formed by identical crystal axes along a plane parallel to the film forming surface of the polycrystalline substrate, is equal to or less than 30°, when depositing constituent particles emitted from a target consisting of the constituent elements of the polycrystalline thin film on the polycrystalline substrate, the temperature of the polycrystalline substrate is set within a range from 150° C. to 250° C. and the ion beam energy of the ion beam emitted from an ion source is adjusted within a range from 175 eV to 225 eV. Thereby, it is possible to form a polycrystalline thin film consisting of $Yb_2O_3$ that forms a film having a good crystal orientation directly on the polycrystalline substrate, which has been impossible to do using conventional technology.

In particular, in the production method for a polycrystalline thin film comprising the structure described above, by setting the temperature of the polycrystalline substrate within a range from 150° C. to 250° C. and adjusting the ion beam energy of the ion beam emitted by an ion source within a range form 175 eV to 225 eV, the value of the full width at half maximum (FWHM), which corresponds to the grain boundary inclination angle, of the polycrystalline thin film consisting of $Yb_2O_3$ can be limited to 20° or less, thereby contributing to providing a polycrystalline thin film having a superior crystal orientation.

In addition, according to the production method for a polycrystalline thin film comprising the structure described above, because it is possible to obtain a polycrystalline thin film consisting of $Yb_2O_3$ that provides superior crystal orientation, it becomes unnecessary to deposit the additional YSZ polycrystalline thin film as is done conventionally. Thus, because the present invention can eliminate the production process necessary for forming two or more layers of film on the polycrystalline substrate that is necessary conventionally, the present invention contributes to the simplification of the processes and holding down the production costs.

According to the production method for the oxide superconducting element according to the present invention, because a polycrystalline thin film consisting of $Yb_2O_3$ is formed by a production method for a polycrystalline thin film comprising the structure described above and subsequently the oxide superconducting layer is formed on the polycrystalline thin film, it becomes possible to produce an oxide superconducting layer on a polycrystalline thin film having extremely good crystal orientation properties, and thereby an oxide superconducting element having a high critical current density Jc that exceeds 400,000 $A/cm^2$ can be obtained. Therefore, the production method for the oxide superconducting element comprising the structure described above contributes to providing stably an oxide superconducting element providing superior superconductive properties.

It is contemplated that numerous modifications may be made to the methods of the present invention without departing from the spirit and scope of the invention as defined in the following claims.

What is claimed is:

1. A method of producing a polycrystalline thin film on a film forming surface of a polycrystalline substrate, the polycrystalline thin film comprising oxide crystal grains having a C-type rare earth crystal structure represented by a formula $Yb_2O_3$ and showing a value of full width at half maximum of 20° or less in X-ray diffraction with the θ-2θ method, the method comprising:
depositing constituent grains emitted from a target comprising constituent elements of the polycrystalline thin film;
setting a temperature of the polycrystalline substrate within a range from 150° C. to 250° C. during depositing the constituent grains;
generating an ion beam of at least one of $Ar^+$, $Kr^+$, and $Xe^+$ from an ion source;
adjusting the ion beam energy of the ion beam within a range from 175 eV to 225 eV; and
irradiating the ion beam, having the adjusted ion beam energy, on the film forming surface of the substrate at an angle of incidence from 50° to 60° with respect to the normal of the film forming surface while depositing the constituent grains on the substrate.

2. A method of producing a polycrystalline thin film according to claim 1, wherein the polycrystalline substrate is one of a board, a plate, a wire, a tape.

3. A method of producing a polycrystalline thin film according to claim 1, wherein the polycrystalline substrate is formed by at least one of silver, platinum, stainless steel, copper, an Ni alloy, glass and ceramics.

4. A method of producing a polycrystalline thin film according to claim 1, wherein the temperature of the polycrystalline substrate is set from 175° C. to 200° C. during depositing the constituent grains.

5. A method of producing a polycrystalline thin film according to claim 1, wherein:
first axes of the oxide crystal grains of the polycrystalline thin film align normal to the film forming surface of the polycrystalline substrate;
second axes of the oxide crystal grains of the polycrystalline thin film are aligned with respect to each other and oriented parallel to a plane of the film forming surface of the polycrystalline substrate,
third axes of the oxide crystal grains of the polycrystalline thin film are aligned with respect to each other and oriented parallel to a plane of the film forming surface of the polycrystalline substrate, and
the second axes is perpendicular to the third axes.

6. A method of producing a polycrystalline thin film according to claim 1, wherein the polycrystalline substrate does not comprise YSZ or MgO, and no layer having YSZ or MgO is formed between said film forming surface of the polycrystalline substrate and said polycrystalline thin film.

7. A method of producing an oxide superconducting element that comprises a polycrystalline substrate, a polycrystalline thin film comprising oxide crystal grains having a C-type rare earth crystal structure represented by a formula $Yb_2O_3$ formed on a film forming surface of the polycrystalline substrate and showing a value of full width at half maximum of 20° or less in X-ray diffraction with the θ-2θ method, the method comprising:
depositing constituent grains emitted from a target comprising constituent elements of the polycrystalline thin film;
setting a temperature of the polycrystalline substrate within a range from 150° C. to 250° C. during depositing the constituent grains;
generating an ion beam of at least one of $Ar^+$, $Kr^+$, and $Xe^+$ from an ion source;
adjusting the ion beam energy of the ion beam within a range from 175 eV to 225 eV;
irradiating the ion beam, having the adjusted ion beam energy, on the film forming surface of the substrate at an angle of incidence from 50° to 60° with respect to the normal of the film forming surface while depositing the constituent grains on the substrate; and forming the oxide superconductor layer on the polycrystalline thin film.

8. A method of producing an oxide superconducting element according to claim 7, wherein the oxide superconductor layer is selected from the group consisting of the compounds $YBa_2Cu_3O_{7-x}$ ($0<X<0.5$), $YBa_2Cu_4O_8$, $(Bi, Pb)_2Ca_2Sr_2Cu_3O_{10}$, $Tl_2Ba_2Ca_2Cu_3O_{10}$, $Tl_1Ba_2Ca_2Cu_3O_9$, and $Tl_1Ba_2Ca_3Cu_4O_{11}$.

9. A method of producing an oxide superconducting element according to claim 7, wherein the polycrystalline substrate does not comprise YSZ or MgO, and no layer having YSZ or MgO is formed between said film forming surface of the polycrystalline substrate and said oxide superconductor layer.

* * * * *